United States Patent [19]

Meiling et al.

[11] 3,998,686
[45] Dec. 21, 1976

[54] SAPPHIRE GROWTH FROM THE MELT USING POROUS ALUMINA RAW BATCH MATERIAL

[75] Inventors: Gerald S. Meiling; Walter L. Morgan, both of Painted Post, N.Y.

[73] Assignee: Corning Glass Works, Corning, N.Y.

[22] Filed: Mar. 10, 1975

[21] Appl. No.: 556,651

[52] U.S. Cl. .................. 156/617 R; 23/273 SP; 156/615; 222/56; 222/450; 423/600
[51] Int. Cl.² .................. B01J 17/18; C01F 7/02
[58] Field of Search .......... 156/617, 618, 619, 605, 156/615; 23/273 SP; 222/56, 445, 450; 423/600

[56] References Cited

UNITED STATES PATENTS

| | | | |
|---|---|---|---|
| 3,212,671 | 10/1965 | Rock | 222/56 |
| 3,471,266 | 10/1969 | Belle, Jr. | 156/608 |
| 3,634,045 | 1/1972 | Dugdale et al. | 156/617 |
| 3,960,503 | 6/1976 | Rice | 23/273 SP |

Primary Examiner—Wilbur L. Bascomb, Jr.
Assistant Examiner—Barry I. Hollander
Attorney, Agent, or Firm—Richard N. Wardell; Clarence R. Patty, Jr.

[57] ABSTRACT

A method of growing sapphire crystals from the melt wherein a porous alumina raw material is used to replenish the melt during growth. The porous alumina is subjected to a high temperature, low pressure environment to remove adsorbed water and oxygen which, if allowed to enter the melt, would result in poor monocrystals. A sequence of steps is provided which allows a simultaneous outgassing of one charge of porous alumina and a continuous replenishing of the melt with porous alumina of a previously outgassed charge. The previously outgassed charge of alumina must be handled in a system devoid of water and oxygen to avoid readsorption of the impurities.

4 Claims, 1 Drawing Figure

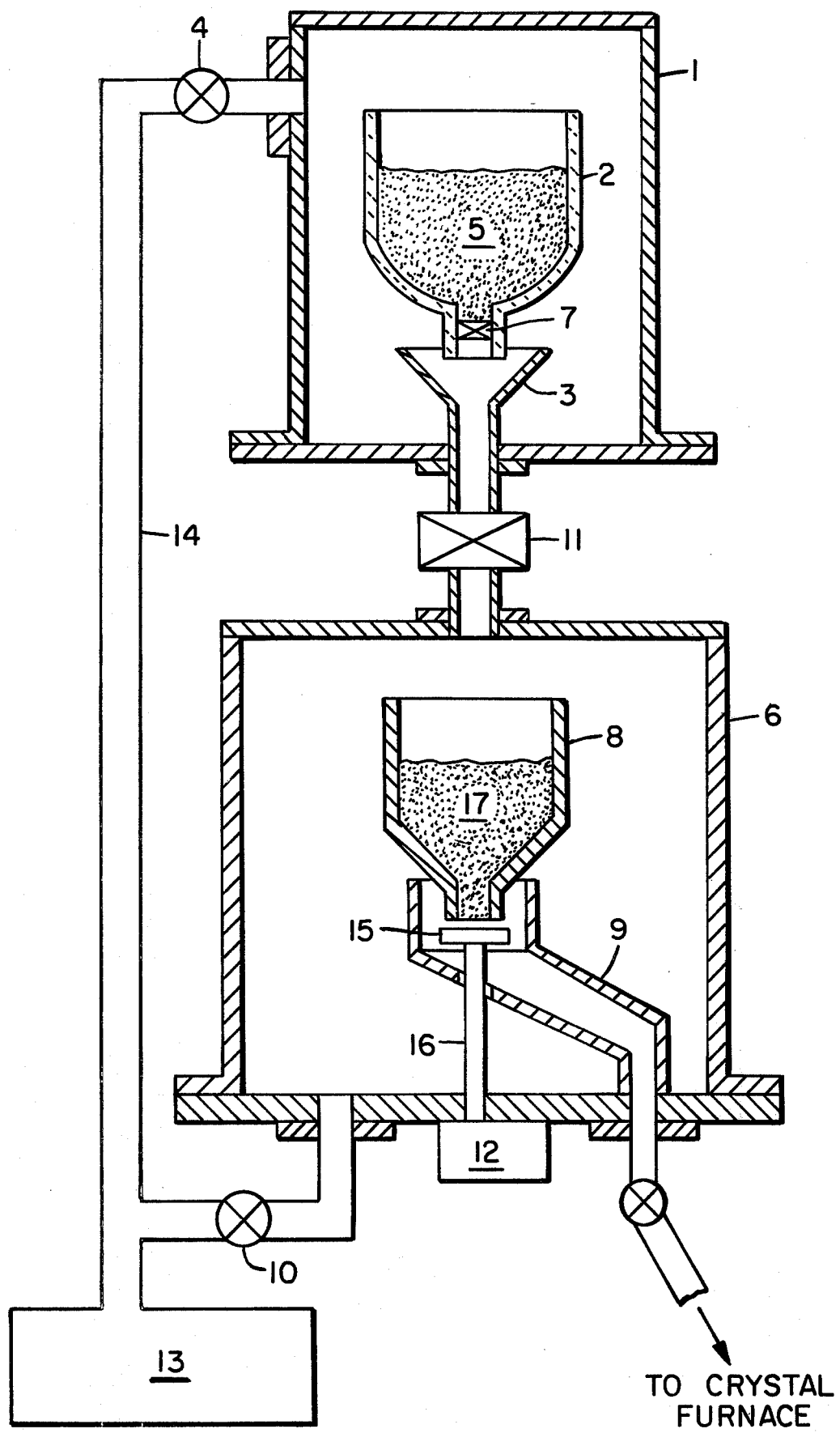

SAPPHIRE GROWTH FROM THE MELT USING POROUS ALUMINA RAW BATCH MATERIAL

BACKGROUND OF THE INVENTION

The invention relates to the use of polycrystalline, porous alumina as a raw material for replenishing the melt which is consumed in growing monocrystals from the melt. Heretofore, the only satisfactory raw material has been what is known as crackle, a fully dense crushed boule of substantially single crystal alumina. The expense of using such a material has prompted the search for alternate materials. Sintered alumina, which costs substantially less to produce, is a likely candidate, however, direct substitution of the porous, sintered alumina for the crackle as a raw material has produced poor crystal growth and poor quality crystals. In particular, the light transmission of substantially monocrystalline tubing grown from the melt decreased by more than 50% with the raw material substitution. In addition to lower transmission of grown tubes, problems of actually completing the full growth of tubing were prevalent with the sintered material prior to the present invention. Refractory metal dies used in the growth process were also severely chemically attacked, limiting their use to one growth cycle.

Growth of crystalline or substantially monocrystalline bodies from a melt of material is not new. Various methods of growing crystals from the melt surface or from a die surface are known in the art. For example, see U.S. Pat. Nos. 3,471,266, 3,591,348, and 3,687,633, wherein a seed crystal is brought in contact with a temperature controlled melt or melt film and is subsequently pulled away from the melt as the crystallization of the melt takes place on the seed crystal. Various shaped crystals can be grown by appropriate use of refractory metal dies and control of thermal distributions and crystal pulling rates from the die surfaces.

The present invention is an improvement over these and other methods of growing crystals from the melt wherein the use of porous alumina raw batch for replenishing the melt is enabled.

The present invention is also an improvement over an earlier filed application Ser. No. 537,042, filed Dec. 27, 1974, now U.S. Pat. No. 3,960,503 and assigned to the present assignee. That invention concerned a novel feeder apparatus for use in crystal growing systems and as such may be used in the method of the present invention.

SUMMARY OF THE INVENTION

It is an object of the present invention to provide a method of growing substantially monocrystalline alumina bodies from a melt derived from porous, polycrystalline alumina.

It is a further object of the invention to provide a method of growing substantially monocrystalline alumina bodies of high light transmission.

It is a further object of the invention to provide a method of continuously supplying clean porous alumina raw batch material to the melt crucible in the inert atmosphere of the crystal growing furnace.

In accordance with the objectives, our invention is a method of growing substantially monocrystalline bodies from a melt of a porous alumina raw material and a method of replenishing melt consumed during crystal growth therefrom using porous alumina, wherein the method comprises:

removing substantially all or a portion of the adsorbed water, oxygen or other adsorbed gases from the porous alumina in a first chamber by means of a vacuum treatment at elevated temperatures, thereafter transferring in an inert atmosphere at least a portion of the pretreated or "clean" porous alumina to a second or feeder chamber which is also maintained under an inert atmosphere, isolating the first and second chambers so that the process of the first chamber may be repeated independently of the second chamber, metering and delivering the clean porous alumina as required to maintain the melt level of the crucible in the crystal growing furnace, and growing substantially monocrystalline alumina bodies from the melt by any known method, such as by seeding the melt or a melt film and thereafter withdrawing the seed at a rate sufficient to maintain crystal growth on the seed.

The clean alumina is maintained in an inert atmosphere throughout the process so that readsorption of gaseous impurities does not take place. Temperatures of about 800°–1100° C. and pressure of about $10^{-5}$ to $10^{-6}$ torr for about 8–36 hours have been used in the first or vacuum chamber to remove about 0.25–0.60 grams of water per kilogram of porous alumina depending on the starting purity. Typically the adsorbed water is reduced to less than 0.001% by weight of the sintered material. Such clean material is suitable for growing very good quality sapphire tubes from the melt. Argon and helium have been employed as inert gases throughout the remainder of the process following vacuum bakeout of the material.

Metering of the raw material from the second chamber to the crucible in the crystal growing furnace as required to maintain the level of the melt during crystal growth therefrom is accomplished by any known means, such as by the use of a rotating disc apparatus as shown in the Figure and as disclosed in copending application Ser. No. 537,042 which is incorporated herein by reference. Herein, however, the second chamber need not operate at elevated temperature or pressure such as suggested therein but only with an impurity free atmosphere which will not poison the clean raw material. Other small, motor-driven, material handling devices such as belt conveyors or bucket conveyors could also be used to meter or dispense the clean material from the hopper in the second chamber at a preselected rate and deliver it to the crucible in the crystal growing furnace.

DESCRIPTION OF THE PREFERRED EMBODIMENTS

The FIGURE is a schematic diagram of a preferred system for implementing the present process wherein the flow path of the porous alumina may be envisioned.

In the FIGURE, the porous alumina raw batch 5 is deposited in the 4000 cc ceramic charge hopper 2 in the first chamber 1. The first chamber or vacuum furnace is then vacuum sealed and evacuated to about 5 × $10^{-5}$ torr by means of a vacuum pump 13 communicating with the vacuum furnace through conventional vacuum system pipelines 14. The first chamber may suitably be a double-walled, water cooled, stainless steel belljar and may be sealed using elastomer or metal "O"-ring seals. Molybdenum heating elements and support parts are also suitable materials for use in the first chamber.

While maintaining the first chamber under vacuum, the temperature is raised by means of electric elements (not shown) to about 800 °C for about 24 hours, or for a time sufficient to reduce the adsorbed impurities (particularly oxygen and $H_2O$) from the raw material before the furnace is allowed to cool to about 500° C. Typically at least 95% of the water may be removed from the porous alumina so that the absolute level is less than about 0.001% by weight of the alumina.

At this point the adsorbed impurities have been substantially removed (the alumina is said to be clean) and the raw material must only be transported at the required rate to the crucible in the crystal growing furnace. The remainder of the present process enables both the transportation of the material without additional exposure to vaporous impurities and the separation of the metering function from the vacuum bakeout function so that both may occur simultaneously and continuously.

Again referring to the FIGURE, the first chamber 1 is isolated from the vacuum pump 13 by means of a valve 4, for example, and then is backfilled to a pressure of about 750 torr with an inert gas (source not shown) such as helium. When the first chamber has cooled to about 200° C the helium is evacuated by means of the vacuum pump 13 and the vacuum furnace is again isolated from the pump and is backfilled to atmospheric pressure with argon (source not shown). Helium was used in the initial cooling of the first chamber because of its higher thermal conductivity than nitrogen, thus allowing a quicker cool-down.

A vacuum gate valve 11 and a hopper valve 7 are then opened, causing the clean batch 5 to fall to a funnel 3 which directs the flow to a feeder hopper 8 inside the second chamber 6. The gate valve and hopper valve may then be closed thereby isolating the first and second chambers and allowing the repeat of the vacuum bakeout process in the first chamber with a second batch of alumina raw material.

Prior to accepting the clean alumina 17, the second chamber has been evacuated through valve 10 by means of the vacuum pump 13 and then backfilled with argon to atmospheric pressure. The second chamber is thereafter maintained with an inert atmosphere to prevent readsorption of impurities by the clean alumina.

From the feeder hopper in the second chamber the alumina batch is metered to the crucible at a rate sufficient to maintain the melt level. A convenient metering device which is disclosed in copending U.S. application Ser. No. 537,042 is shown in the Figure as a disc shaped element 15, slightly below the hopper and slightly larger in diameter than the hopper opening and attached to a rod member 16 extending outside the second chamber to a motor 12. The motor rotates the rod and disc thereby dispensing the alumina batch at the desired rate. The rate of dispensing depends, among other things, on the speed of rotation, the spacing between the disc and the hopper opening, the relative size of the hopper opening and the disc and the particle size of the alumina. When the disc is rotating the metered raw batch falls to the feeder funnel 9, which communicates with the crystal growing furnace (not shown) and the crucible therein. The alumina is delivered to the melt in the crucible where it also melts.

In the preferred growth process for sapphire tubing, at least one die member having a flat, circular upper surface is disposed in the crucible. A melt film is established on the flat surface and is maintained by means of capillary action of the melt through orifices leading from below the melt level to the flat upper surface in the die. An example of a die is shown in U.S. Pat. No. 3,687,633, which is incorporated herein by reference. A seed crystal is brought in contact with the melt film and with proper temperature control the melt crystallizes on the seed as it is withdrawn from the die.

In present crystal growing furnaces the seed can be withdrawn to a height of about 150 cm before the tube is removed, thus completing one growth cycle. During this growth cycle the melt is consumed or is at least removed from the crucible as it solidifies in the crystal and hence must be replaced so that growth may continue in this and in further growth cycles. The present invention therefore provides the method of continuously replacing or replenishing the melt with the porous alumina raw batch material which melts in the crucible and resolidifies in the monocrystal. Additionally, the present independent, two-stage process allows continuous growth cycles to be undertaken since clean batch material can always be available without a 24 hour stoppage while a raw material charge is being vacuum degassed.

Maintenance of inert atmospheres following the bakeout or degassing assures that the clean alumina will remain clean and that good quality sapphire can be drawn. As earlier noted, tubing which could be drawn with "as sintered" porous alumina typically showed light transmission of 50–60%. On the other hand, tubing was easily drawn using alumina processed according to the present invention and which typically had a transmission of at least 90% or better.

When we speak of maintaining an "inert" atmosphere after the removal of impurities we mean that the atmosphere should be dry and impurity free. This could mean an inert gas or a vacuum, but although the two chambers as well as the crystal furnace could be held under vacuum, we prefer to use the more simple backfilling technique with inert gas in the second chamber and the crystal growing furnace.

By the term "porous alumina" we mean a polycrystalline alumina which contains at least about 2% porosity. The polycrystalline and porous natures of the batch are the distinguishing features from the formerly used crackle material and are, of course, the properties which may be related to the adsorptive behavior of the original sintered alumina.

We claim:
1. A method of growing substantially monocrystalline highly transparent alumina bodies on a seed crystal from the melt and using a polycrystalline, porous alumina raw batch material to continuously replenish the melt during successive growth cycles comprising the steps of:
   A. vacuum degassing a charge of the porous alumina raw batch material in a first chamber at a temperature sufficient to substantially eliminate adsorbed water and oxygen in the alumina, thereafter,
   B. transferring the charge of porous alumina in an inert atmosphere to a second chamber,
   C. maintaining an inert atmosphere in the second chamber,
   D. isolating the atmosphere of the first chamber from the atmosphere of the second chamber so that step A may be repeated independently of the atmosphere of the second chamber,
   E. metering the porous alumina under the inert atmosphere from the second chamber to the crucible in the crystal growing furnace at a rate sufficient to maintain the melt level in the crucible, and
F. growing substantially monocrystalline alumina bodies from the melt in the crystal growing furnace.

2. The method of claim 1 wherein the water in the porous alumina raw batch is reduced to less than about 0.001% by weight.

3. The method of claim 1 wherein the temperature of the first chamber sufficient to reduce adsorbed impurities is between about 800°–1100° C and the vacuum degassing is accomplished with a vacuum pressure of between about $10^{-5}$ and $10^{-6}$ torr for about 8–36 hours.

4. The method of claim 1 wherein the vacuum degassing is accomplished at a pressure of not greater than about $5 \times 10^{-5}$ torr.

* * * * *